(12) United States Patent
Kimura et al.

(10) Patent No.: US 11,404,393 B2
(45) Date of Patent: Aug. 2, 2022

(54) WIRE BONDING METHOD AND WIRE BONDING DEVICE

(71) Applicant: KAIJO CORPORATION, Tokyo (JP)

(72) Inventors: Eiji Kimura, Tokyo (JP); Hiroaki Suzuki, Tokyo (JP); Yoshikazu Tashiro, Tokyo (JP)

(73) Assignee: KAIJO CORPORATION, Tokyo (JP)

( * ) Notice: Subject to any disclaimer, the term of this patent is extended or adjusted under 35 U.S.C. 154(b) by 0 days.

(21) Appl. No.: 16/760,627

(22) PCT Filed: Aug. 23, 2018

(86) PCT No.: PCT/JP2018/031221
§ 371 (c)(1),
(2) Date: Apr. 30, 2020

(87) PCT Pub. No.: WO2020/039566
PCT Pub. Date: Feb. 27, 2020

(65) Prior Publication Data
US 2021/0366869 A1 Nov. 25, 2021

(51) Int. Cl.
*B23K 20/00* (2006.01)
*H01L 23/00* (2006.01)

(52) U.S. Cl.
CPC ............ *H01L 24/78* (2013.01); *B23K 20/005* (2013.01); *H01L 24/48* (2013.01); *H01L 24/85* (2013.01); *H01L 2224/48175* (2013.01); *H01L 2224/48465* (2013.01); *H01L 2224/78268* (2013.01); *H01L 2224/78301* (2013.01);
(Continued)

(58) Field of Classification Search
CPC .. B23K 20/004; B23K 20/005; B23K 20/007; B23K 37/04-0461; H01L 24/85; H01L 24/78; H01L 24/48; H01L 2224/48465; H01L 2224/78354; H01L 2224/48175; H01L 2224/78804; H01L 2224/85181; H01L 2224/85206; H01L 2224/85045;
(Continued)

(56) References Cited

U.S. PATENT DOCUMENTS 4,610,387 A * 9/1986 Scavino ............... B23K 20/005
228/1.1
5,024,367 A * 6/1991 Terakado ............... B23K 20/10
228/111
(Continued)

FOREIGN PATENT DOCUMENTS

JP 57154846 A * 9/1982 ............. B23Q 1/621
JP 61226936 A * 10/1986 ............. H01L 24/78
(Continued)

OTHER PUBLICATIONS

International Search Report dated Dec. 25, 2018 in International (PCT) Application No. PCT/JP2018/031221.

*Primary Examiner* — Kiley S Stoner
(74) *Attorney, Agent, or Firm* — Wenderoth, Lind & Ponack, L.L.P.

(57) ABSTRACT

A wire bonding method includes bringing a capillary and a wire inserted through the capillary into pressure contact with a bonding point of a lead placed on an XY stage to bond the wire to the lead, including moving the XY stage in a state in which the capillary is in pressure contact with the lead to move the capillary along a movement locus including a plurality of arc portions.

5 Claims, 7 Drawing Sheets

(52) U.S. Cl.
CPC ............... *H01L 2224/78354* (2013.01); *H01L 2224/78804* (2013.01); *H01L 2224/85045* (2013.01); *H01L 2224/85181* (2013.01); *H01L 2224/85206* (2013.01); *H01L 2224/85207* (2013.01)

(58) Field of Classification Search
CPC . H01L 2224/78268; H01L 2224/78301; H01L 2224/85207
USPC .................................... 228/4.5, 180.5, 904
See application file for complete search history.

(56) References Cited

U.S. PATENT DOCUMENTS

| | | | | |
|---|---|---|---|---|
| 5,060,841 | A * | 10/1991 | Oshima | G05B 19/353 228/102 |
| 5,177,032 | A * | 1/1993 | Fogal | H01L 23/49506 228/175 |
| 5,326,014 | A * | 7/1994 | Morita | B23K 20/106 228/110.1 |
| 5,816,477 | A * | 10/1998 | Shimizu | B23K 20/007 228/102 |
| 6,116,490 | A * | 9/2000 | Suzuki | B23K 20/106 228/1.1 |
| 6,362,014 | B1 * | 3/2002 | Takahashi | H01L 24/80 438/14 |
| 2010/0059574 | A1 * | 3/2010 | Arahata | H01L 24/48 228/180.5 |
| 2010/0200969 | A1 * | 8/2010 | Huang | H01L 24/85 257/666 |
| 2010/0301101 | A1 * | 12/2010 | Seyama | H01L 24/78 228/105 |
| 2011/0315743 | A1 * | 12/2011 | Maruya | B23K 20/10 228/102 |
| 2015/0279810 | A1 * | 10/2015 | Wong | H01L 24/49 257/666 |
| 2016/0365330 | A1 * | 12/2016 | Hagiwara | H01L 24/78 |
| 2017/0110437 | A1 * | 4/2017 | Garing | H01L 23/4952 |
| 2019/0378814 | A1 * | 12/2019 | Zhong | H01L 24/78 |

FOREIGN PATENT DOCUMENTS

| | | | | |
|---|---|---|---|---|
| JP | 62249437 | A * | 10/1987 | ............ H01L 24/78 |
| JP | 2-299249 | | 12/1990 | |
| JP | 2000340603 | A * | 12/2000 | ............ H01L 24/78 |
| JP | 2004-14715 | | 1/2004 | |
| JP | 2010-199142 | | 9/2010 | |
| JP | 4595018 | | 12/2010 | |
| JP | 2012-138476 | | 7/2012 | |
| JP | 2017-168735 | | 9/2017 | |

* cited by examiner

WIRE BONDING METHOD AND WIRE BONDING DEVICE

TECHNICAL FIELD

The present invention relates to wire bonding methods and wire bonding devices.

BACKGROUND ART

Japanese Patent No. 4595018 discloses the following conventional technology.

A bonding device is prepared, which includes a bonding stage on which a bonding target provided with a lead surface is placed, a capillary through which a bonding wire is inserted, pressure contact means for bringing the capillary and the bonding wire inserted through the capillary into pressure contact with the lead surface of the bonding target placed on the bonding stage, scrub means for rotating the capillary spirally in a direction orthogonal to the pressure direction of the capillary when the capillary is in pressure contact with the lead surface, and a control unit.

Next, the pressure contact means based on an instruction from the control unit in the bonding device is used to bring a capillary through which a bonding wire is inserted and the bonding wire inserted through the capillary into pressure contact with a lead surface of a bonding target placed on the bonding stage.

Next, the scrub means based on instructions (X-axis instruction position x and Y-axis instruction position y illustrated in FIG. 9B) from the control unit in the bonding device is used to rotate the capillary spirally in a direction orthogonal to the pressure direction of the capillary when the capillary is in pressure contact with the lead surface. The operation to rotate the capillary spirally refers to an operation in which the position at which the capillary contacts the lead surface is set as a reference position, and the capillary is spirally rotated while increasing the radius from the reference position, and then the capillary is spirally rotated while decreasing the radius and returned to the reference position (see FIG. 9A).

Now, scrub operation is described. FIG. 9A is a diagram illustrating a movement locus of the capillary that performs the scrub operation, and FIG. 9B is a diagram illustrating instruction positions for driving an X-axis linear motor and a Y-axis linear motor. Note that the X-axis linear motor and the Y-axis linear motor are means for moving a bonding head.

As illustrated in FIG. 9A, the scrub operation is an operation for driving the X-axis linear motor and the Y-axis linear motor to spirally rotate the capillary held by the bonding head so as to spirally rotate the capillary with respect to the lead surface. Specifically, the position at which the capillary contacts the lead surface is set as a reference position (0,0), and the capillary is spirally rotated while increasing the radius of rotation from the reference position. When the radius of rotation becomes maximum, the capillary is spirally rotated while reducing the radius of rotation, and the capillary is returned to the reference position.

In the shove-mentioned conventional technology, the capillary is spirally rotated while increasing the radius from the reference position, and then the capillary is spirally rotated while reducing the radius. Accordingly, at least two parts of the capillary pass through the same position. As a result, there is a fear in that wire breakage may easily occur and the productivity may reduce.

SUMMARY OF INVENTION

Technical Problem

It is an object of one aspect of the present invention to provide a wire bonding method or a wire bonding device capable of suppressing the occurrence of wire breakage.

Solution to Problem

Various aspects of the present invention are described below.

[1] A wire bonding method for bringing a capillary and a wire inserted through the capillary into pressure contact with a lead placed on an XY stage to bond the wire to the lead, including moving the XY stage in a state in which the capillary is in pressure contact with the lead to move the capillary along a movement locus including a plurality of arc portions.

[2] In the wire bonding method according to item [1], the capillary is moved along a movement locus having no crossing portion.

[3] In the wire bonding method according to item [1] or [2], lengths of the plurality of arc portions are set such that an arc portion located closer to an end point of the movement locus is longer.

[4] In the wire bonding method according to any one of items [1] to [3], the plurality of arc portions are disposed such that, of adjacent arc portions, a beginning of an arc portion located closer to an end point of the movement locus is in proximity to a terminal of an arc portion located closer to a start point of the movement locus, the movement locus includes a connected portion connecting the beginning of the arc portion located closer to the end point and the terminal of the arc portion located closer to the start point, and the movement locus has a zig-zag shape formed by the plurality of arc portions and connected portions connecting the arc portions.

[5] In the wire bonding method according to any one of items [1] to [4], ultrasonic vibration is applied to the capillary before or after the XY stage is moved or at the same time when the XY stage is moved.

[6] A wire bonding device, including:

an XY stage for placing a lead thereon;

a mechanism for moving the XY stage in an X direction;

a mechanism for moving the XY stage in a Y direction;

a capillary for inserting a wire therethrough;

a mechanism for bringing the capillary into pressure contact with the lead;

a mechanism for applying ultrasonic vibration to the capillary; and a control unit for controlling the mechanism for moving the XY stage in the X direction, the mechanism for moving the XY stage in the Y direction, the mechanism for bringing the capillary into pressure contact with the lead, and the mechanism for applying the ultrasonic vibration, in which the control unit controls the mechanism for moving the XY stage in the X direction and the mechanism for moving the XY stage in the Y direction such that the XY stage is moved in a state in which the capillary and the wire inserted through the capillary are in pressure contact with the lead placed on the XY stage, so that the capillary moves along a movement locus including a plurality of arc portions.

[7] In the wire bonding device according to item [6], the control unit controls the mechanism for moving the XY stage in the X direction and the mechanism for moving the XY stage in the Y direction such that the capillary moves in a zig-zag manner in the state in which the capillary and the wire are in pressure contact with the lead.

[8] In the wire bonding device according to item [6] or [7], the control unit controls the mechanism for applying the ultrasonic vibration such that ultrasonic vibration is applied to the capillary before or after the XY stage is moved or at the same time when the XY stage is moved.

[9] In the wire bonding device according to any one of items [1] to [5], a whole or a part of the plurality of arc portions are concentric arc portions.

Advantageous Effects of Invention

According to one aspect of the present invention, the wire bonding method or the wire bonding device capable of suppressing the occurrence of wire breakage can be provided.

DESCRIPTION OF EMBODIMENTS

Embodiments of the present invention are described in detail below with reference to the drawings. The present invention is not limited to the following description, and it should be easily understood by a person skilled in the art that the form and details of the present invention can be variously changed without departing from the gist of the present invention and the scope thereof. Thus, the present invention is not intended to be interpreted by being limited to the contents described in the following embodiments.

Figure 4:
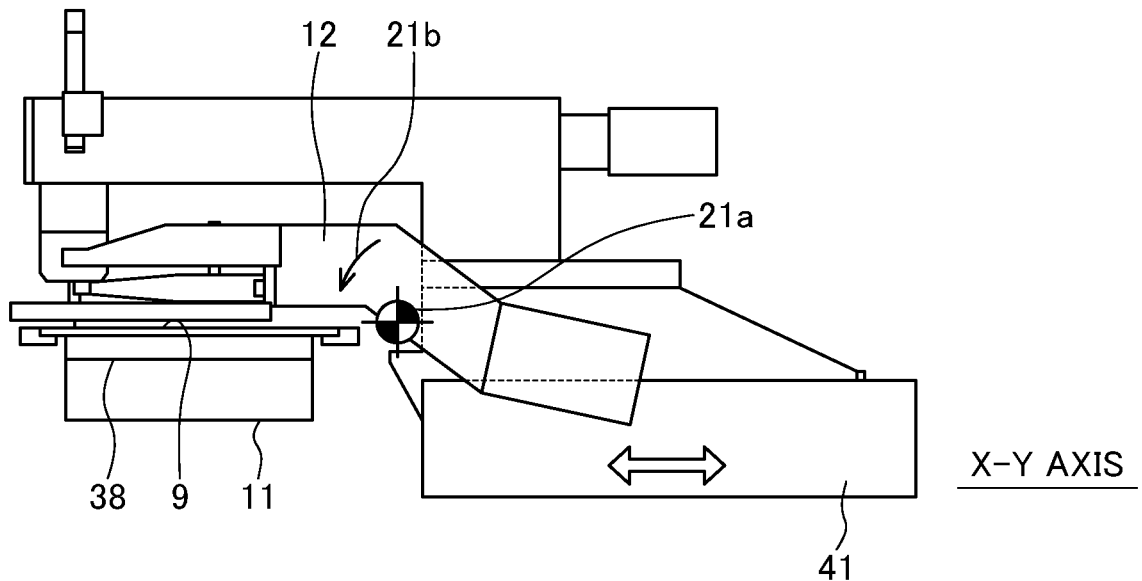
FIG. 4 is a schematic view illustrating a wire bonding device according to one aspect of the present invention.

FIG. 4 is a schematic view illustrating a wire bonding device according to one aspect of the present invention. The wire bonding device is a device for electrically connecting an electrode and a lead by a wire. Note that the electrode is, for example, an electrode of a semiconductor chip, and the lead is, for example, a lead of a lead frame.

Figure 5:
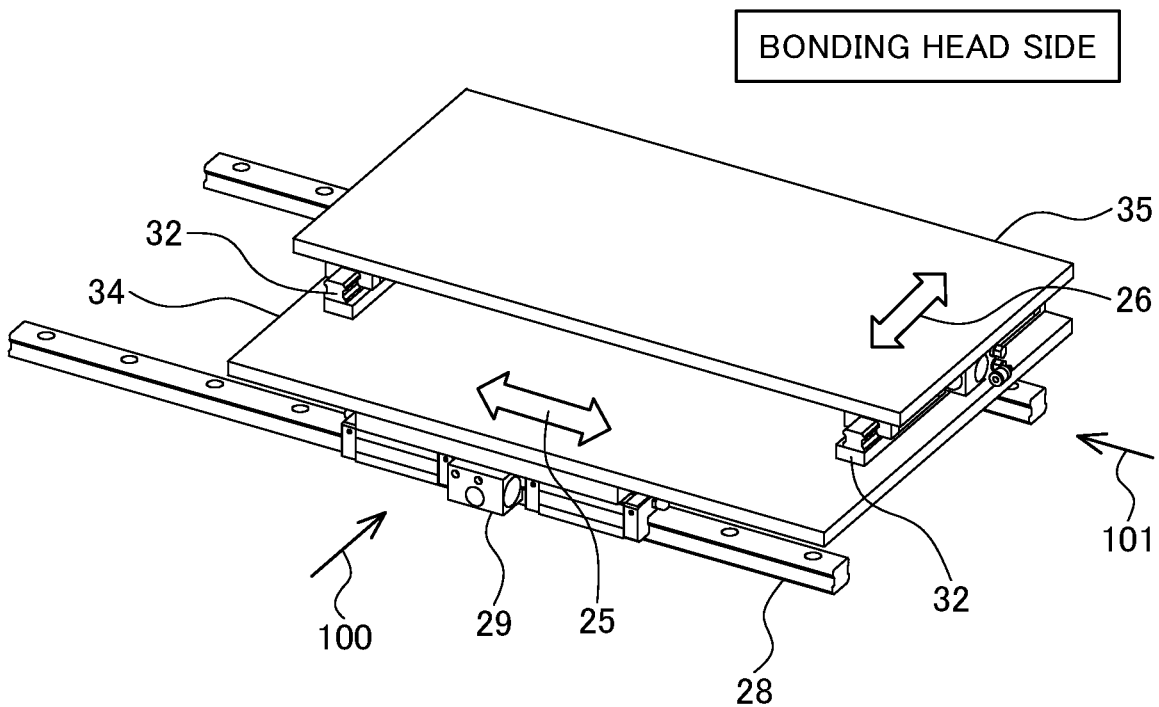
FIG. 5 is a perspective view illustrating an XY drive mechanism 11 in the wire bonding device illustrated in FIG. 4.
Figure 6A:
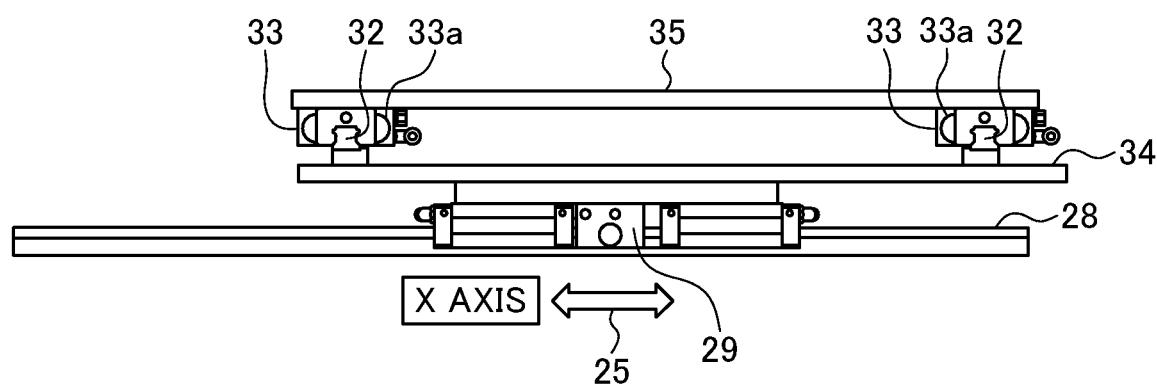
FIG. 6A is a diagram illustrating an X-axis drive mechanism and a Y-axis drive mechanism as seen from a direction of an arrow 100 illustrated in FIG. 5.

FIG. 5 is a perspective view illustrating an XY drive mechanism 11 in the wire bonding device illustrated in FIG. 4. FIG. 6A is a view illustrating an X-axis drive mechanism and a Y-axis drive mechanism as seen from a direction of an arrow 100 illustrated in FIG. 5, and FIG. 6B is a view illustrating the X-axis drive mechanism and the Y-axis drive mechanism as seen from a direction of an arrow 101 illustrated in FIG. 5.

The wire bonding device illustrated in FIG. 4 has an XY stage 38, and the XY stage 38 is a stage for holding a lead frame 9 and an electrode (pad) of a semiconductor chip (not shown). The XY stage 38 has a function of performing positioning operation between the a lead of the lead frame 9 and the pad of the semiconductor chip. The XY stage 38 has an XY drive mechanism 11 mounted thereon. The XY drive mechanism 11 has an X-axis drive mechanism for moving the XY stage 38 in an X direction and a Y-axis drive mechanism for moving the XY stage 38 in a Y direction. The X-axis drive mechanism is a mechanism for moving the XY stage 38 along an X-axis guide 28 in a direction of an arrow 25. The Y-axis drive mechanism is a mechanism for moving the XY stage 38 along a Y-axis guide 32 in a direction of an arrow 26.

Figure 6B:
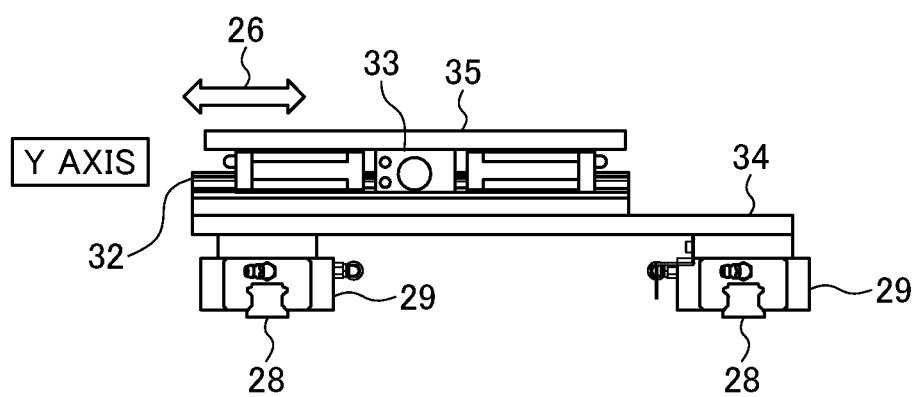
FIG. 6B is a diagram illustrating the X-axis drive mechanism and the Y-axis drive mechanism as seen from a direction of an arrow 101 illustrated in FIG. 5.

Specifically, as illustrated in FIG. 5 and FIGS. 6A and 6B, an X table 34 can be moved by the X-axis drive mechanism along the X-axis guide 28 in the direction of the arrow 25. The X table 34 has the Y-axis guide 32 mounted thereon, and a Y table 35 can be moved by the Y-axis drive mechanism along the Y-axis guide 32 in the direction of the arrow 26.

The X-axis guide 28 is provided with an X-axis guide lock portion 29 for locking the X-axis guide 28. When the X-axis guide lock portion 29 is fixed to the X-axis guide 28, the X table 34 is fixed.

The X-axis drive mechanism is configured to freely move the XY stage 38 (see FIG. 4) in the direction of the arrow 25 along the X-axis guide 28 together with the X table 34.

The Y-axis guide 32 is provided with a Y-axis guide lock portion 33 for locking the Y-axis guide 32, and the Y-axis guide lock portion 33 has a third lock portion 33a to be pressed against the Y-axis guide 32 by pressure of air. When the Y-axis guide lock portion 33 is fixed to the Y-axis guide 32, the Y table 35 is fixed.

The Y-axis drive mechanism is configured to freely move the XY stage 38 in the direction of the arrow 26 along the Y-axis guide 32 together with the Y table 35.

The wire bonding device illustrated in FIG. 4 has a bonding head 12. The bonding head 12 is mounted to an XY table 41, which is a drive mechanism capable of moving in an X-Y axis (two-dimensional direction), and the bonding head 12 can be moved by the XY table 41. The bonding head 12 is mounted to a rotation shaft 21a, and the rotation shaft 21a can rotate by a rotational drive mechanism. By rotating the bonding head 12 by the rotation shaft 21a, the bonding head 12 can move in a Z-axis direction 21b.

The wire bonding device illustrated in FIG. 4 has a capillary through which a wire is inserted, a mechanism for bringing the capillary into pressure contact with an electrode or a lead to be bonded, a mechanism for applying ultrasonic vibration to the capillary, and a control unit. The control unit controls the X-axis drive mechanism, the Y-axis drive mechanism, and the mechanism for applying ultrasonic vibration, and details thereof are described later.

A bonding arm is vertically swung by a linear motor or a cam coupled to a motor shaft in the bonding head 12 mounted on the XY table 41, and the wire is fed from the capillary attached to the distal end of an ultrasonic horn of the bonding arm. High voltage is applied between the distal end of the wire and a discharge electrode to cause discharge. The distal end of the wire is molten by the discharge energy to form a ball at the distal end of the wire. The ball held at the distal end of the capillary pressed against an electrode of a semiconductor chip, which is a first bonding point, by mechanical pressure force obtained by the swinging of the bonding arm. Ultrasonic waves and heating means are used in combination to perform thermocompression bonding, thereby connecting the wire to the first bonding point.

Figure 1A:
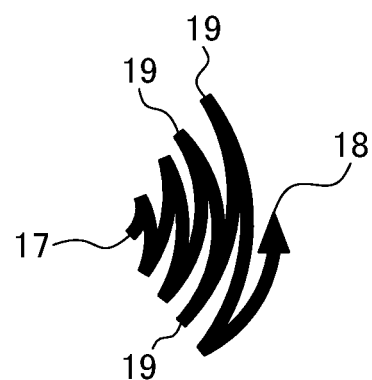
FIG. 1A is a diagram illustrating a movement locus of a capillary.

FIG. 1A is a diagram illustrating a locus (movement locus of capillary) along which the XY stage 38 is moved by the XY drive mechanism 11 illustrated in FIG. 4. In other words, FIG. 1A illustrates a locus along which the XY stage 38 is moved in the state in which the capillary and the wire inserted through the capillary are in pressure contact with the lead placed on the XY stage 38.

Figure 1B:
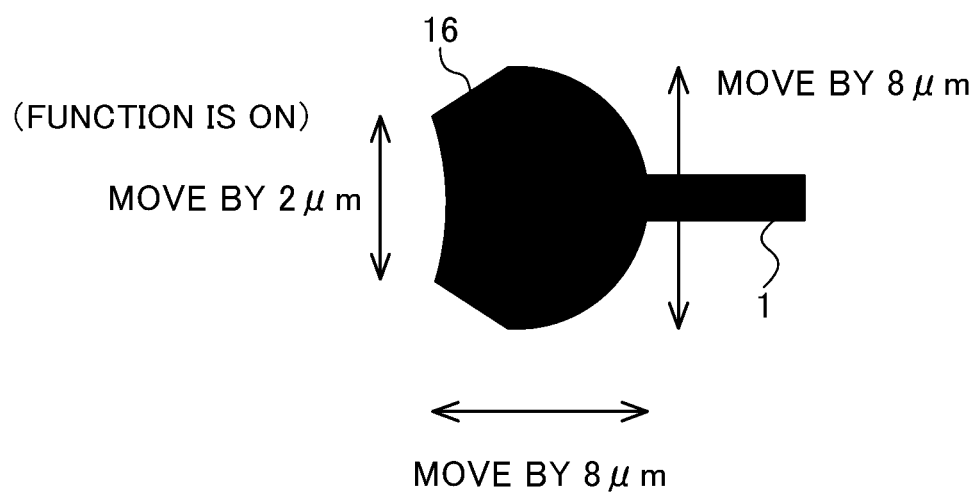
FIG. 1B is a plan view illustrating a shape in which a wire is bonded on a lead at a second bonding point 16.

FIG. 1B is a plan view illustrating a shape in which the wire is bonded on the lead at a second bonding point 16 formed as a result of moving the XY stage 38 along the locus illustrated in FIG. 1A and moving the capillary and the wire inserted through the capillary on the lead along the locus illustrated in FIG. 1A.

FIGS. 7A to 7D are diagrams for describing steps for performing wire bonding by the wire bonding device illustrated in FIG. 4.

Next, a wire bonding method using the wire bonding device illustrated in FIG. 4 is described.

Figure 7A:
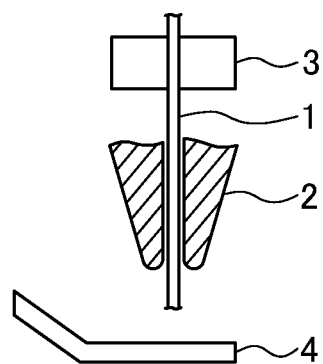
FIGS. 7A to 7D are diagrams for describing steps for performing wire bonding by the wire bonding device illustrated in FIG. 4.
Figure 7B:
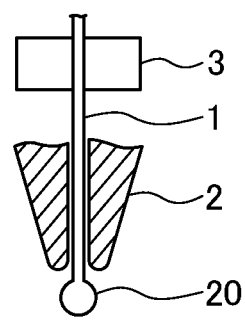

As illustrated in FIGS. 7A and 7B, discharge is caused for a given period of time between the distal end of the wire 1 fed to the distal end of the capillary 2 and a discharge electrode 4, so that the distal end of the wire 1 is molten to form a ball 20. The ball is held at the distal end of the capillary 2, and the capillary 2 is located immediately above an electrode 12a of a semiconductor chip 13 serving as a first bonding point 15. Note that the electrode 12a is positioned by the XY stage 38.

Figure 7C:
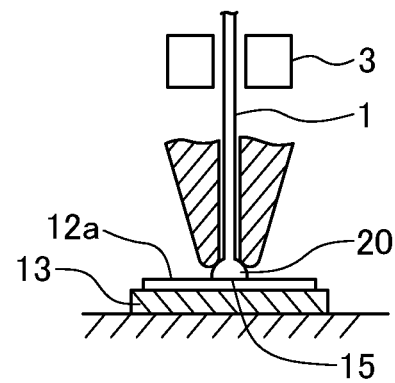

Next, as illustrated in FIG. 7C, the capillary 2 is lowered in the Z-axis direction to press the ball 20 against the electrode 12a of the semiconductor chip under pressure, and at the same time, ultrasonic vibration is applied to the distal end of the capillary 2 through the ultrasonic horn of the bonding arm. In this manner, the wire 1 is connected to the electrode 12a. Note that the Z-axis direction is a direction perpendicular to the XY stage 38.

Figure 7D:
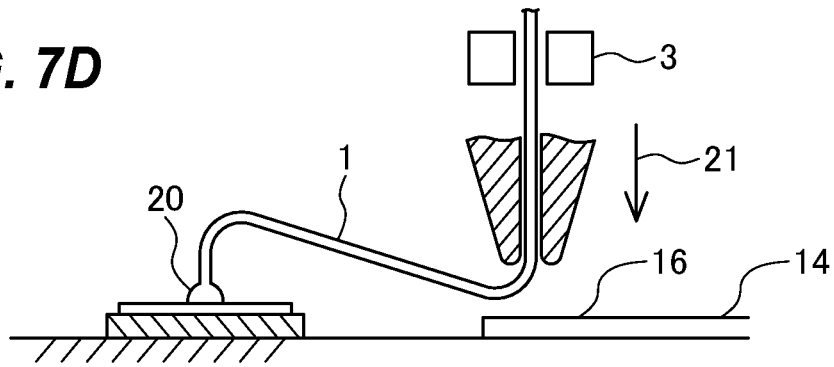

Next, as illustrated in FIG. 7D, the capillary 2 is raised in accordance with predetermined loop control, and moved in the direction of the lead 14 serving as the second bonding point 16. The lead 14 is a lead of the lead frame 9 placed on the XY stage 38 illustrated in FIG. 4. The lead 14 is positioned by the XY stage 38.

Next, the capillary 2 is lowered in the Z-axis direction 21, and the capillary 2 and the wire 1 inserted through the capillary 2 are brought into pressure contact with the lead 14. In this state, the XY stage 38 is moved, and the capillary 2 is moved along a movement locus including a plurality of arc portions (see FIG. 1A). The capillary 2 is preferably moved along a movement locus having no crossing portion. The lengths of the plurality of arc portions are preferably set such that an arc portion located closer to an end point 18 of the movement locus is longer. In other words, the capillary 2 and the wire 1 inserted through the capillary 2 are moved on the lead 14 along the movement locus illustrated in FIG. 1A. Specifically, the plurality of arc portions are disposed such that, of adjacent arc portions, the beginning of an arc portion located closer to the end point 18 of the movement locus is in proximity to the terminal of an arc portion located closer to the start point 17 of the movement locus. The movement locus includes a connected portion 19 connecting the beginning of the arc portion located closer to the end point 18 and the terminal of the arc portion closer to the start point 17, and the movement locus preferably has a zig-zag shape formed by the plurality of arc portions and the connected portions 19 connecting each arc portion. The whole or a part of the plurality of arc portions preferably have concentric arc portions. In this manner, the wire can be always brought into intimate contact with a new ground surface, and the intimate contact area can be increased. As a result, the wire 1 can be bonded to the second bonding point 16 of the lead 14 with the shape of the bonding portion of the wire 1 illustrated in FIG. 1B. By increasing the bonding area in this manner, the bonding strength can be improved.

The operation to move the XY stage 38 such that the movement locus has a zig-zag shape is an operation to alternatingly move the XY stage 38 in one direction and an opposite direction of the X axis by the X-axis drive mechanism while alternatingly moving the XY stage 38 in one direction and an opposite direction of the Y axis by the Y-axis drive mechanism. It is preferred that the movement distance in the opposite direction of the X axis be shorter than the movement distance in the one direction of the X axis in the previous movement, and the movement distance after the movement direction of the Y axis is reversed be equal to or longer than (that is, not shorter than) the movement distance before the movement direction of the Y axis is reversed. In this manner, as illustrated in FIG. 1A, the length of a curve such as an arc or a part of an ellipse increases gradually. As a result, the occurrence of wire breakage can be suppressed.

When the capillary 2 is moved on the lead 14 in a zig-zag manner like the movement locus illustrated in FIG. 1A, the centerline of the movement locus of the capillary 2 does not pass through the same point, and the movement locus of the capillary 2 has no crossing portion. In other words, by moving the XY stage 38 in a zig-zag manner while shifting the capillary 2 such that the centerline of the movement locus of the capillary 2 does not pass through the same point, the occurrence of wire breakage can be suppressed. This is because wire breakage is more liable to occur when the centerline of the movement locus of the capillary 2 passes through the same point. Note that the centerline of the movement locus of the capillary 2 refers to the centerline of a locus along which the capillary 2 moves in contact with the lead 14.

Ultrasonic vibration is preferably applied to the distal end of the capillary 2 through the ultrasonic horn before or after the XY stage 38 is moved in a zig-zag manner or at the same time when the XY stage 38 is moved in a zig-zag manner.

After the wire 1 is bonded to the lead 14 as described above, the capillary 2 is raised such that a wire cut clamp 3 is closed at a rising position of the capillary 2 set in advance, and the wire on the lead 14 is cut to complete single bonding work.

Figure 2:
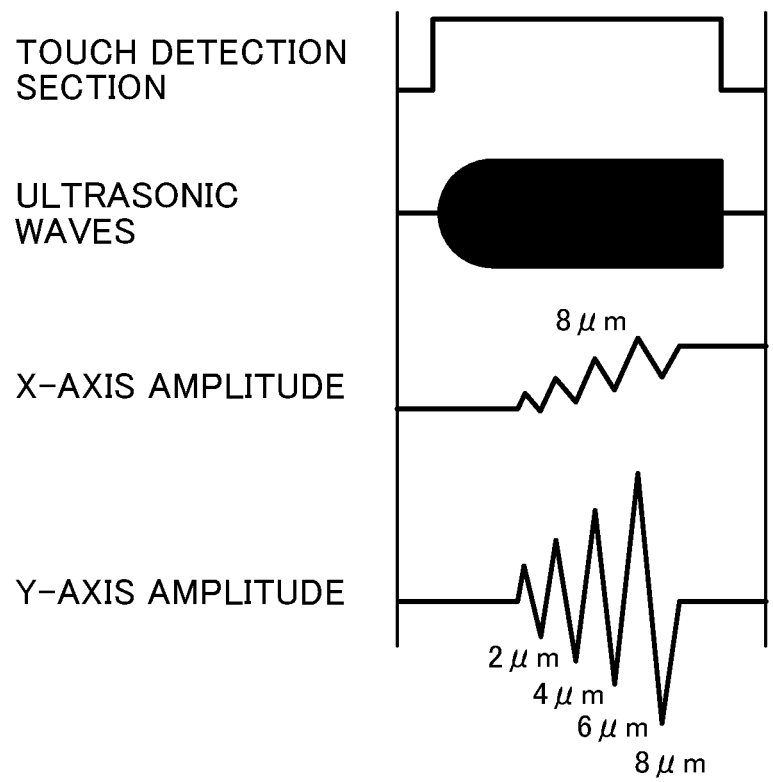
FIG. 2 is a diagram illustrating X-axis amplitude and Y-axis amplitude for moving an XY stage 38 along the locus illustrated in FIG. 1A and timing to apply ultrasonic waves.
Figure 8:
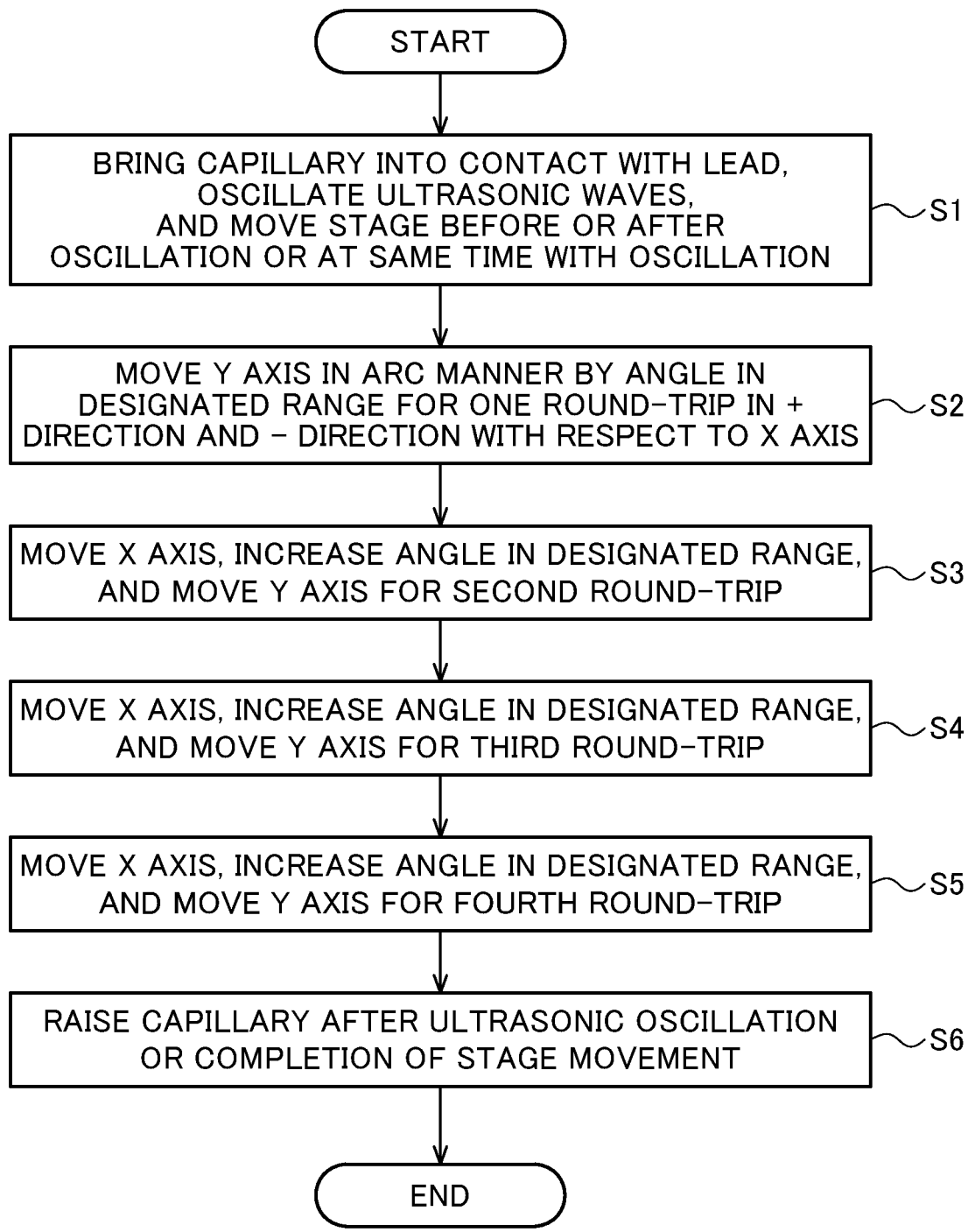
FIG. 8 is a diagram for more specifically describing the step for bonding a lead 14 to the wire 1 illustrated in FIG. 7D.
Figure 9A:
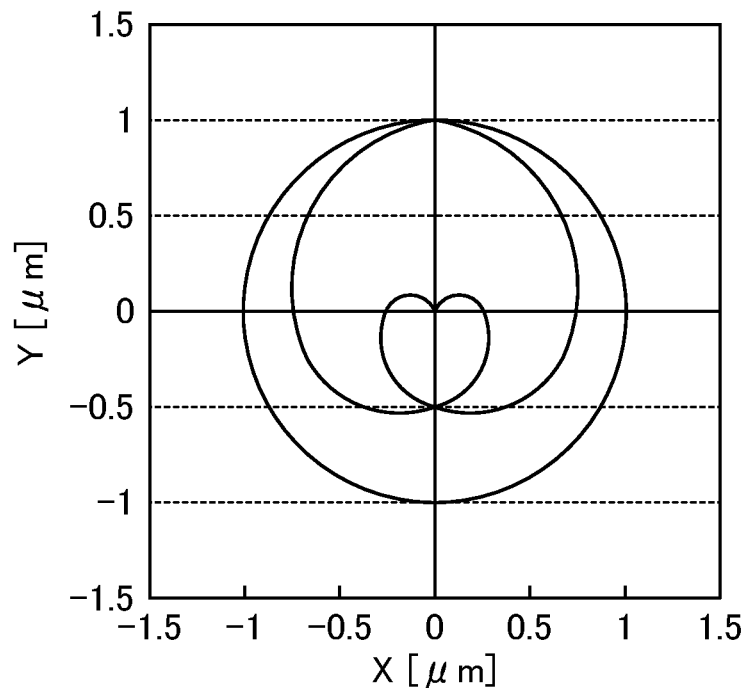
FIGS. 9A and 9B are diagrams for describing a conventional wire bonding method.
Figure 9B:
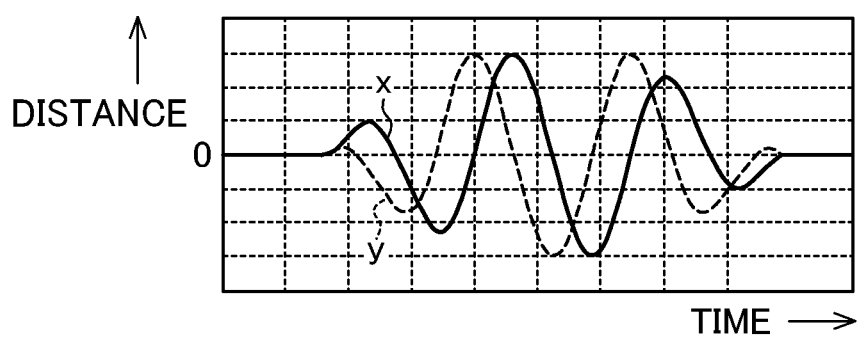

FIG. 8 is a diagram for more specifically describing the step for bonding the lead 14 and the wire 1 illustrated in FIG. 7D. FIG. 2 is a diagram illustrating X-axis amplitude and Y-axis amplitude for moving the XY stage 38 along the locus as illustrated in FIG. 1A and timing to apply ultrasonic waves.

The capillary 2 is brought into contact with the lead 14, and ultrasonic waves are oscillated to move the XY stage 38 before or after the oscillation or at the same time with the oscillation (S1). Specifically, as illustrated in FIG. 2, after the fact that the capillary 2 has contacted the lead 14 is detected, the XY stage 38 is moved by 8 µm while alternatingly moving the XY stage 38 in one direction and an opposite direction of the X axis by the X-axis drive mechanism and alternatingly moving the XY stage 38 in one direction and an opposite direction of the Y axis by the Y-axis drive mechanism. The amplitude in the Y axis at this time increases in order of 2 µm, 4 µm, 6 µm, and 8 µm. Note that, in FIG. 2, ultrasonic waves are oscillated at the same time when the capillary 2 contacts the lead 14. The X-axis drive mechanism, the Y-axis drive mechanism, the mechanism for bringing the capillary into pressure contact with the lead, and the oscillation of ultrasonic waves are controlled by the control unit in the wire bonding device.

When the XY stage 38 is moved as illustrated in FIG. 2, the capillary 2 moves as indicated by S2 to S5 in FIG. 8. Specifically, the Y axis is moved in an arc manner by an angle in a designated angle for one round-trip in a + direction and a – direction with respect to the X axis (S2). In this case, the X axis is moved in a + direction and a – direction with respect to the Y axis. The amplitude in the Y axis in this case is 2 µm. Subsequently, the X axis is moved in the + direction and the – direction with respect to the Y axis, and the angle in the designated range is increased, so that the Y axis is moved for the second round-trip (S3). The amplitude in the Y axis in this case is 4 µm. Subsequently, the X axis is moved in the + direction and the – direction with respect to the Y axis, and the angle in the designated range is increased, so that the Y axis is moved for the third round-trip (S4). The amplitude in the Y axis in this case is 6 µm. Subsequently, the X axis is moved in the + direction and the – direction with respect to the Y axis, and the angle in the designated range is increased, so that the Y axis is moved for the fourth round-trip (S5). The amplitude in the Y axis in this case is 8 µm. In this manner, the XY stage 38 can be moved along the movement locus illustrated in FIG. 1A, and the shape of the bonding portion of the wire 1 can be formed at the second bonding point 16 of the lead illustrated in FIG. 1B. As a result, a region of the bonding portion of 8 µm is formed in each of the X-axis direction and the Y-axis direction as illustrated in FIG. 1B. Note that, as illustrated in FIG. 1A, the bonding start point 17 and the bonding end point 18 are located at different positions, and hence the bonding area increases and the bonding strength increases.

Next, the capillary 2 is raised after the ultrasonic oscillation or the completion of the movement of the stage.

Figure 3:
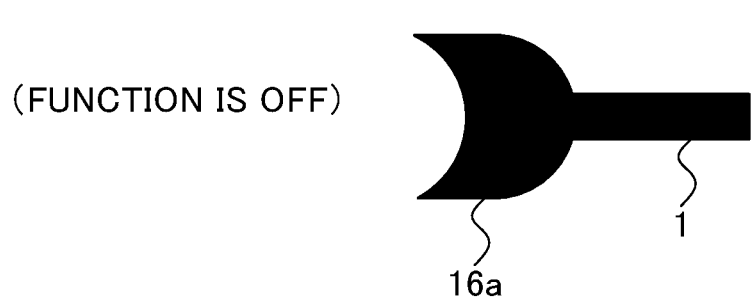
FIG. 3 is a plan view illustrating a shape of a bonding portion of a wire 1 according to a comparative example.

FIG. 3 is a plan view illustrating the shape of a bonding portion of a wire 1 according to a comparative example. In this comparative example, when the wire 1 was bonded to the second bonding point 16a of the lead 14, the function for moving the XY stage 38 as illustrated in FIG. 1 was OFF, and only ultrasonic vibration was applied to the capillary 2.

Comparing FIG. 3 and FIG. 1B, it is understood that the area of the bonding portion of the wire 1 illustrated in FIG. 1B obtained when the function for moving the XY stage 38 was ON and ultrasonic vibration was applied to the capillary 2 is more than twice as large as the area obtained when the function was OFF in FIG. 3, and as a result, bonding strength can be improved.

The control unit in the wire bonding device illustrated in FIG. 4 is described.

The control unit controls the X-axis drive mechanism for moving the XY stage 38 in the X direction and the Y-axis drive mechanism for moving the XY stage 38 in the Y direction such that the XY stage 38 is moved in the state in which the capillary 2 and the wire 1 inserted through the capillary 2 are in pressure contact with the lead 14 placed on the XY stage 38, so that the capillary 2 moves along a movement locus including a plurality of arc portions. In other words, the control unit controls the X-axis drive mechanism and the Y-axis drive mechanism such that the capillary 2 moves in a zig-zag manner in the state in which the capillary 2 and the wire 1 are in pressure contact with the lead 14. Such control can obtain the movement locus of the capillary 2 illustrated in FIG. 1A.

The control unit can control the X-axis drive mechanism for moving the XY stage 38 in the X direction and the Y-axis drive mechanism for moving the XY stage 38 in the Y direction such that the XY stage 38 is alternatingly moved in one direction and an opposite direction of the X axis, the XY stage is alternatingly moved in one direction and an opposite direction of the Y axis, the movement distance in the opposite direction of the X axis is shorter than the movement distance in the one direction of the X axis in the previous movement, and the movement distance after the movement direction of the Y axis is reversed is equal to or longer than the movement distance before the movement direction of the Y axis is reversed.

The control unit can control the mechanism for applying ultrasonic vibration such that ultrasonic vibration is applied to the capillary 2 before or after the XY stage 38 is moved or at the same time when the XY stage 38 is moved.

In this embodiment, even for a small-space lead, the bonding strength can be improved by using the shape of the bonding portion of the wire 1 illustrated in FIG. 1B. Consequently, the wire 1 can be reliably bonded to a small-space lead.

Note that the case where the wire 1 is stretched in the X-axis direction has been described in this embodiment, but the wire 1 can be stretched in directions (actually, any direction of 360°) other than the X-axis direction. For example, the case where the wire 1 is stretched in a first axis direction can be described as follows. The operation to move the XY stage 38 such that the capillary 2 is moved along a movement locus including a plurality of arc portions is an operation to alternatingly move the XY stage 38 in one direction and an opposite direction of the first axis and alternatingly move the XY stage 38 in one direction and an opposite direction of a second axis orthogonal to the first axis. The movement distance in the opposite direction of the first axis is preferably shorter than the movement distance in the one direction in the previous movement, and the movement distance after the movement direction of the second axis is reversed is preferably equal to or longer than the movement distance before the movement direction of the second axis is reversed. The contents described in this embodiment corresponds to the state in which the first axis in the above description is the X axis and the second axis is the Y axis.

In this embodiment, as illustrated in FIG. 2, the numbers of amplitudes 2 µm, 4 µm, 6 µm, and 8 µm of the Y axis when the XY stage 38 is alternatingly moved by the Y-axis drive mechanism in one direction and an opposite direction of the Y axis are each one, but the numbers of amplitudes 2 µm, 4 µm, 6 µm, and 8 µm of the Y axis may each be two or more times, and the numbers of the amplitudes of the Y axis are not necessarily required to be the same.

EXPLANATION OF SYMBOLS

1 Wire
2 Capillary

3 Wire cut clamp
4 Discharge electrode
9 Lead frame
11 XY drive mechanism
12 Bonding head
12a Electrode
13 Semiconductor chip
14 Lead
15 First bonding point
16, 16a Second bonding point
17 Bonding start point
18 Bonding end point
19 Connected portion connecting each arc portion
20 Ball
21 Z-axis direction
25, 26 Arrow
28 X-axis guide
29 X-axis guide lock portion
32 Y-axis guide
33 Y-axis guide lock portion
33a Third lock portion
34 X table
35 Y table
38 XY stage
41 XY table

The invention claimed is:

1. A wire bonding method for bringing a capillary and a wire inserted through the capillary into pressure contact with a lead placed on an XY stage to bond the wire to the lead, the wire bonding method comprising:
    moving the XY stage in a state in which the capillary is in pressure contact with the lead to move the capillary along a movement locus including a plurality of arc portions,
    wherein a centerline of the movement locus does not pass through a same point twice, in order to suppress breakage of the wire.

2. The wire bonding method according to claim 1, wherein one of the plurality of arc portions located closer to an end point of the movement locus is longer.

3. The wire bonding method according to claim 1, wherein: the movement locus includes a connected portion connecting (i) a beginning of one of the plurality of arc portions located closer to an end point of the movement locus, and (ii) a terminal of one of the plurality of arc portions located closer to a start point of the movement locus; and
    the movement locus has a zig-zag shape formed by the plurality of arc portions and the connected portion.

4. A wire bonding device, comprising:
    an XY stage for placing a lead thereon;
    a first mechanism for moving the XY stage in an X direction;
    a second mechanism for moving the XY stage in a Y direction;
    a capillary for inserting a wire therethrough;
    a third mechanism for bringing the capillary into pressure contact with the lead;
    a fourth mechanism for applying ultrasonic vibration to the capillary; and
    a control unit for controlling the first mechanism, the second mechanism, the third mechanism, and the fourth mechanism,
    wherein:
    the control unit is configured to control the first mechanism and the second mechanism such that the XY stage is moved in a state in which the capillary and the wire inserted through the capillary are in pressure contact with the lead placed on the XY stage, so that the capillary moves along a movement locus including a plurality of arc portions; and
    a centerline of the movement locus does not pass through a same point twice, in order to suppress breakage of the wire.

5. The wire bonding device according to claim 4, wherein the control unit is configured to control the first mechanism and the second mechanism such that the capillary moves in a zig-zag shape in the state in which the capillary and the wire inserted through the capillary are in pressure contact with the lead placed on the XY stage.

* * * * *